US012776787B2

(12) United States Patent
Kanemoto et al.

(10) Patent No.: US 12,776,787 B2
(45) Date of Patent: Oct. 27, 2026

(54) SIGNAL COMPRESSION APPARATUS, SIGNAL RECONSTRUCTION APPARATUS, AND SIGNAL PROCESSING SYSTEM

(71) Applicant: OSAKA UNIVERSITY, Osaka (JP)

(72) Inventors: Daisuke Kanemoto, Osaka (JP); Kotaro Nagai, Osaka (JP)

(73) Assignee: OSAKA UNIVERSITY, Osaka (JP)

( * ) Notice: Subject to any disclaimer, the term of this patent is extended or adjusted under 35 U.S.C. 154(b) by 137 days.

(21) Appl. No.: 18/840,966

(22) PCT Filed: Jan. 31, 2023

(86) PCT No.: PCT/JP2023/002981
§ 371 (c)(1), (2) Date: Aug. 23, 2024

(87) PCT Pub. No.: WO2023/162588
PCT Pub. Date: Aug. 31, 2023

(65) Prior Publication Data
US 2025/0167804 A1 May 22, 2025

(30) Foreign Application Priority Data
Feb. 28, 2022 (JP) ................................ 2022-028896

(51) Int. Cl.
*H03M 7/42* (2006.01)
*H03M 7/30* (2006.01)

(52) U.S. Cl.
CPC ......... *H03M 7/425* (2013.01); *H03M 7/6005* (2013.01)

(58) Field of Classification Search
CPC ... H03M 7/425; H03M 7/6005; H03M 7/3062
See application file for complete search history.

(56) References Cited

U.S. PATENT DOCUMENTS 4,675,750 A * 6/1987 Collins ................ H04N 19/619 375/240
5,955,976 A * 9/1999 Heath ..................... H03M 7/46 341/51

(Continued)

FOREIGN PATENT DOCUMENTS

JP 2021-115429 A 8/2021

OTHER PUBLICATIONS

Extended European Search Report for corresponding European Application No. 23759594.7 dated May 16, 2025.

(Continued)

*Primary Examiner* — Lam T Mai
(74) *Attorney, Agent, or Firm* — Renner, Otto, Boisselle & Sklar, LLP

(57) ABSTRACT

A measurement signal processing unit includes a reception part that receives a compression signal y obtained by using an observation matrix Φ from a time-series detection signal of a measurement target, and a reconstruction part that reconstructs the received compression signal y. The reconstruction part includes the observation matrix Φ and a dictionary matrix Ψ including a past signal of the measurement target, obtains an estimation vector ^s by inputting the compression signal y and a sensing matrix θ to a reconstruction algorithm execution module, and derives a reconstruction signal ^x corresponding to a detection signal x by inputting, to a calculation module for obtaining a product, the obtained estimation vector ^s and the dictionary matrix Ψ.

10 Claims, 8 Drawing Sheets

(56) References Cited

U.S. PATENT DOCUMENTS

| | | | | |
|---|---|---|---|---|
| 6,456,209 | B1 * | 9/2002 | Savari | H03M 7/40 715/236 |
| 8,610,604 | B2 * | 12/2013 | Glass | H03M 7/6076 341/51 |
| 9,230,302 | B1 * | 1/2016 | Owechko | G06T 1/0007 |
| 2002/0109615 | A1 * | 8/2002 | Abdat | H03M 7/3088 341/51 |
| 2005/0071151 | A1 * | 3/2005 | Adl-Tabatabai | H03M 7/30 704/10 |
| 2007/0150497 | A1 * | 6/2007 | De La Cruz | H03M 7/3084 |
| 2009/0060047 | A1 * | 3/2009 | Schneider | H03M 7/40 375/240.23 |
| 2011/0099295 | A1 * | 4/2011 | Wegener | H03M 7/46 711/170 |
| 2012/0063689 | A1 | 3/2012 | Tran et al. | |
| 2013/0135121 | A1 * | 5/2013 | Glass | H03M 7/6076 341/65 |
| 2014/0064479 | A1 * | 3/2014 | Manikandan | H03M 7/3062 380/28 |
| 2015/0178305 | A1 * | 6/2015 | Mueller | G06F 16/17 707/693 |
| 2021/0336633 | A1 * | 10/2021 | Tseng | H03M 7/3071 |

OTHER PUBLICATIONS

Fira Monica et al., “A Study on Dictionary Selection in Compressive Sensing for ECG Signals Compression and Classification”, Biosensors, vol. 12, No. 3, Feb. 27, 2022, p. 146.

Japanese Office Action for corresponding Japanese Application No. 2024-502941, dated Nov. 5, 2024.

Zhilin Zhang, et al.; “Extension of SBL Algorithms for the Recovery of Block Sparse Signals with Intra-Block Correlation”; IEEE Transactions on Signal Processing, vol. 61, No. 8, pp. 2009-2015, 2013. Cited in specification.

P. Dao, et al.; “K SVD dictionary learning applied in clinical EEG compressed sensing”; ATC 2018, Oct. 2018.

Kotaro Nagai, et al.; “Applying K-SVD Dictionary Learning for EEG Compressed Sensing Framework with Outlier Detection and Independent Component Analysis”; IEICE Transactions on Fundamentals of Electronics, Communications and Computer Sciences, vol. E104-A, No. 09, pp. 1375-1378, Sep. 2021.

Daisuke Kanemoto, et al.; “Compressed Sensing Framework Applying Independent Component Analysis after Undersampling for Reconstructing Electroencephalogram Signals”; IEICE Trans. Fundamentals, vol. E103-A, No. 12, pp. 1647-1654, Dec. 2020.

Shun Katsumata, et al.; “Applying Outlier Detection and Independent Component Analysis for Compressed Sensing EEG Measurement Framework”; in Proc. IEEE Biomed. Circuits Syst. Conf. (BioCAS), Oct. 2019, pp. 1-4.

Daisuke Kanemoto, et al.; “Framework of Applying Independent Component Analysis After Compressed Sensing for Electroencephalogram Signals”; in Proc. IEEE Biomed. Circuits Syst. Conf. (BioCAS), Oct. 2018, pp. 145-148.

Monica Fira, et al.; “Comparison of Inter-and Intra-Subject Variability of P300 Spelling Dictionary in EEG Compressed Sensing”, in (IJACSA) International Journal of Advanced Computer Science and Applications, vol. 7, No. 10, 2016, pp. 366-371.

* cited by examiner

Reference Drawing

Reference Drawing

Reference Drawing

SIGNAL COMPRESSION APPARATUS, SIGNAL RECONSTRUCTION APPARATUS, AND SIGNAL PROCESSING SYSTEM

TECHNICAL FIELD

The present invention relates to a technology to reconstruct a compression signal obtained by compressed sensing, with high accuracy and at a high speed.

BACKGROUND ART

In recent years, with the spread of IoT, the demand for sensing devices that sense the state of a living body or the like and wirelessly transmit a sensed biological signal to a computer (an edge computer) has been further increasing. In a case of devices that sense the biological signal, wearable types to be worn on the body are common, so that the miniaturization and long-term operability of the devices are desired. Accordingly, even a small battery needs to continue to operate for a long period of time, so that the development of a low power consumption technology for the sensing devices is highly requested. In this kind of sensing devices, the power consumption of a circuit for wirelessly transmitting a sensed signal accounts for a high percentage of the total power consumption. Therefore, today, the compressed sensing technology capable of significantly reducing electric power according to wireless transmission by sensing while compressing a signal attracts attention, and mounting to a large number of sensing devices is being considered.

The principle of the compressed sensing is shown in FIG. 8A to FIG. 8C. In FIG. 8A to FIG. 8C, the shading attached to each square determined by rows and columns represents a signal level for convenience, and, in particular, a white square represents the zero level. As shown in FIG. 8A, in the compressed sensing, an observed signal vector x with n elements is multiplied by an m×n ($m<n$) observation matrix $\Phi$ to obtain a compression signal vector y with m elements. Although it is generally impossible, under the condition of $m<n$, to accurately obtain x from y and $\Phi$, in a case in which x is able to be represented by a product of a certain dictionary matrix $\Psi$ and a sparse (that is, including a large number of zero level elements or elements that may be regarded as zero level) vector s (see FIG. 8B), when the sensing matrix $\theta=\Phi\times\Psi$ is set, various algorithms that reconstruct (estimate) the sparse vector s from the compression signal vector y and $\theta$ are present (see FIG. 8C), the product of the dictionary matrix $\Psi$ and a reconstructed estimation vector ˆs is able to obtain a reconstruction signal ˆx that has been reconstructed so that an original signal vector x may be obtained. As a reconstruction algorithm, for example, BSBL (Block Sparse Bayesian Learning) shown in Non-Patent Literature 1, OMP (Orthogonal Matching Pursuit) shown in Non-Patent Literatures 2 and 3, or the like, are well-known. It is important that whether or not reconstruction is possible by the compressed sensing depends on whether the sensed signal is able to be converted into a sparse vector. In other words, it is important that a dictionary matrix that is able to be converted into a vector having high sparsity is present.

While the compressed sensing is one of the important technologies for low power consumption, as a kind of irreversible compression, maintenance and improvement of reconstruction accuracy are desired. However, the reconstruction accuracy and reconstruction time have a trade-off relationship, so that shortening of the time required for reconstruction is a problem to achieve highly accurate reconstruction. For example, the OMP reconstruction algorithm provides a very short reconstruction time but gives no expectation of the accuracy of the reconstruction, and, on the other hand, the BSBL reconstruction algorithm is a highly accurate reconstruction method that utilizes Bayesian estimation but has a computation time-consuming problem.

In addition, the applicants have proposed reconstruction processing (Non-Patent Literatures 4, 5, and 6, for example) with a constant accuracy under the low power consumption technology, the reconstruction processing, as shown in Patent Literature 1, performing compressed processing by sub-Nyquist rate sampling on a side of the sensing device, separating and removing a mixed signal (an artifact) including noise or the like by independent component analysis (ICA: Independent Component Analysis) with respect to the signal on which the sub-Nyquist rate sampling has been performed, on a wireless reception side, and subsequently applying a reconstruction algorithm such as OMP, BSBL, or the like.

CITATION LIST

Patent Literature

Patent Literature 1: Japanese Unexamined Patent Application Publication No. 2021-115429

Non-Patent Literature

Non-Patent Literature 1: Zhilin Zhang et al., "Extension of SBL Algorithms for the Recovery of Block Sparse Signals with Intra-Block Correlation," IEEE Transactions on Signal Processing, vol. 61, no. 8, pp. 2009-2015, 2013

Non-Patent Literature 2: P. Dao, X. J. Li, A. Griffin, and H. Do, "K-SVD dictionary learning applied in clinical EEG compressed sensing," ATC 2018, October 2018.

Non-Patent Literature 3: Kotaro Nagai, Daisuke Kanemoto, and Makoto Ohki, "Applying K-SVD Dictionary Learning for EEG Compressed Sensing Framework with Outlier Detection and Independent Component Analysis," IEICE Transactions on Fundamentals of Electronics, Communications and Computer Sciences, Vol. E104-A, No. 09, pp. 1375-1378, September 2021.

Non-Patent Literature 4: Daisuke Kanemoto, Shun Katsumata, Masao Aihara, and Makoto Ohki, "Compressed Sensing Framework Applying Independent Component Analysis after Undersampling for Reconstructing Electroencephalogram Signals," IEICE Trans. Fundamentals, vol. E103-A, no. 12, pp. 1647-1654, December 2020.

Non-Patent Literature 5: Shun Katsumata, Daisuke Kanemoto, and Makoto Ohki, "Applying Outlier Detection and Independent Component Analysis for Compressed Sensing EEG Measurement Framework," in Proc. IEEE Biomed. Circuits Syst. Conf. (BioCAS), October 2019, pp. 1-4.

Non-Patent Literature 6: Daisuke Kanemoto, Shun Katsumata, Masao Aihara, and Makoto Ohki, "Framework of Applying Independent Component Analysis After Compressed Sensing for Electroencephalogram Signals," in Proc. IEEE Biomed. Circuits Syst. Conf. (BioCAS), October 2018, pp. 145-148

SUMMARY OF INVENTION

Technical Problem

A method that utilizes a dictionary matrix by use of the OMP reconstruction algorithm and a singular value decomposition (K-SVD: Singular Value Decomposition) method that are shown in Non-Patent Literatures 2 and 3 show an improvement compared with a case in which a general DCT (Discrete Cosine Transform) matrix is applied to the dictionary matrix, but has not yet reached the accuracy that BSBL currently achieves.

Incidentally, high-speed reconstruction capable of reconstructing with high accuracy, in a case of being able to be achieved, for example, in the BSBL reconstruction algorithm, could be a useful compressed sensing technology. In the BSBL reconstruction algorithm, as the number of columns in the dictionary matrix Ψ is increased, the reconstruction accuracy tends to improve more. However, as the number of columns is increased, the sensing matrix θ used in the processing of the reconstruction algorithm becomes large, which thus tends to increase the reconstruction time and is affected by the trade-off between the reconstruction accuracy and the reconstruction time, as described above.

In addition, Patent Literature 1, although describing a technology that performs the compression processing by the sub-Nyquist rate sampling and a technology that removes mixed artifacts (noise) by an independent component analysis, does not describe a technology that focuses on the dictionary matrix Ψ and processes the reconstruction processing with high accuracy and at a high speed.

The present invention, in view of the foregoing, is directed to provide a signal compression apparatus, signal reconstruction apparatus, and a signal processing system that enable highly accurate and high-speed reconstruction by applying a past signal being a signal of the same type as a target signal to a dictionary matrix that converts the target signal into a sparse (sparsity possessed) signal.

Solution to Problem

A signal reconstruction apparatus according to the present invention includes a reception part that receives a compression signal obtained by compressing a target signal by use of an observation matrix, and a reconstruction part that reconstructs the received compression signal. The reconstruction part includes the observation matrix, and a dictionary matrix in which a past signal is arranged in each column, the past signal being a signal of the same type as the target signal and being a target signal obtained in advance for a plurality of times, obtains an estimation vector by inputting the received compression signal, the observation matrix, and the dictionary matrix, to a reconstruction algorithm execution module, and derives a reconstruction signal corresponding to the target signal by inputting the obtained estimation vector and the dictionary matrix to a calculation module for obtaining a product.

In addition, a signal compression apparatus according to the present invention includes a compression part that converts the target signal to a compression signal compressed by use of an observation matrix, and a transmission part that transmits the compression signal to a signal reconstruction apparatus.

Moreover, a signal processing system according to the present invention includes a compression part that converts a target signal to a compression signal compressed by use of an observation matrix, and a reconstruction part that reconstructs the compression signal compressed in the compression part. The reconstruction part includes the observation matrix, and a dictionary matrix in which a past signal is arranged in each column, the past signal being a signal of the same type as the target signal and being a target signal obtained in advance for a plurality of times, obtains an estimation vector by inputting the received compression signal, the observation matrix, and the dictionary matrix to a reconstruction algorithm execution module, and derives a reconstruction signal corresponding to the target signal by inputting an obtained estimation vector and the dictionary matrix to a calculation module for obtaining a product.

According to these inventions, when the dictionary matrix in which a past signal is arranged in each column, the past signal being a signal of the same type as the target signal and being a target signal obtained in advance for a plurality of times is created, a dictionary including data that is correlated or highly correlated with the target signal is able to be created, and thus the use of this dictionary makes it possible to convert the obtained target signal into a vector with sparsity. Moreover, since the dictionary matrix is highly correlated, even a dictionary with a small number of columns is able to maintain a required reconstruction accuracy in addition to reducing reconstruction time. It is to be noted that the target signal is able to include a detection signal capable of being detected by a sensor and physical quantity data including various kinds of information existing in nature, and further an artificially created signal.

Advantageous Effects of Invention

According to the present invention, application of a past signal being a signal of the same type as a target signal to a dictionary matrix enables highly accurate and high-speed reconstruction.

BRIEF DESCRIPTION OF DRAWINGS

FIG. 1A is a configuration diagram showing the entire system, and FIG. 1B is an example of a sensor and a sensing unit, and is an external view showing a summary of usage conditions.

FIG. 2A is a diagram of a side of the sensing unit, and FIG. 2B is a diagram of a side of a measurement signal processing unit.

FIG. 4A is a diagram of a dictionary with 20 columns in a case of being sorted, and FIG. 4B is a diagram of a smaller dictionary obtained by selecting 11 columns from the 20 columns in FIG. 4A, in consideration of an appearance rate.

FIG. 8A is a diagram illustrating obtaining a compression signal vector y by use of a signal vector x and a certain observation matrix Φ, FIG. 8B is a diagram representing the signal vector x as a product of the certain dictionary matrix Ψ and a thin sparse vector s, and FIG. 8C is a diagram showing a relationship between a sensing matrix θ (=Φ×Ψ) and an estimation vector ^s corresponding to the sparse vector s from the compression signal vector y, in a reconstruction process.

DESCRIPTION OF EMBODIMENTS

Figure 1A:
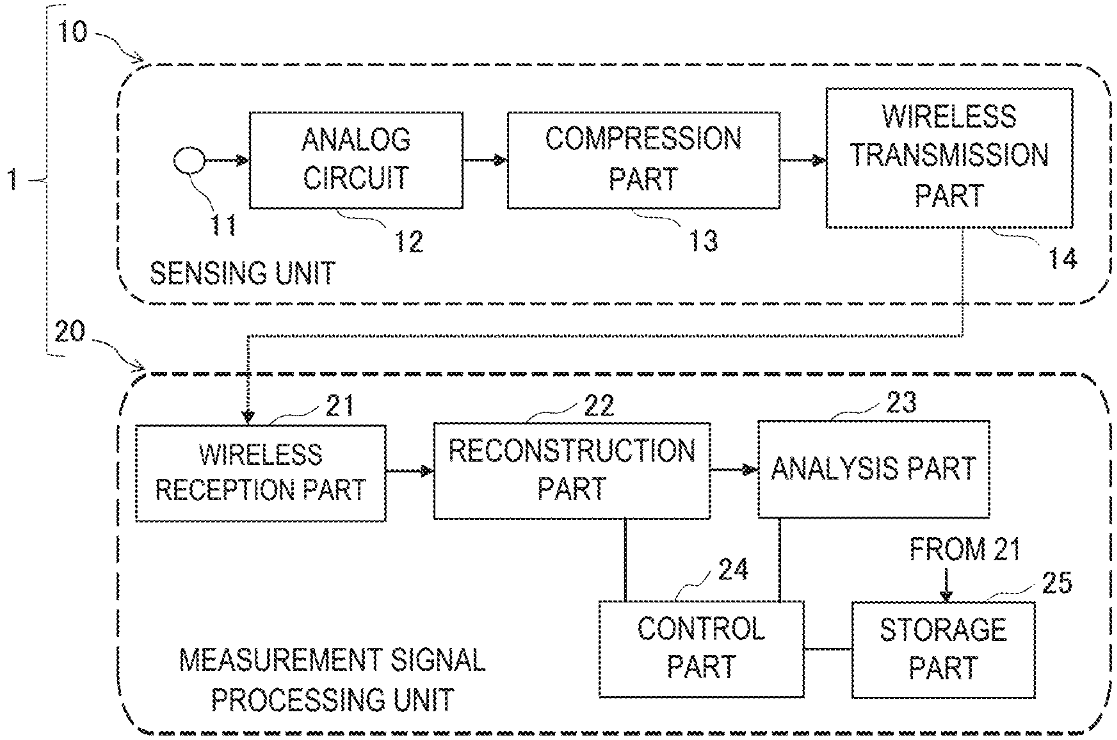
FIG. 1A and FIG. 1B are block diagrams showing one embodiment of a signal measurement system according to the present invention.
Figure 1B:
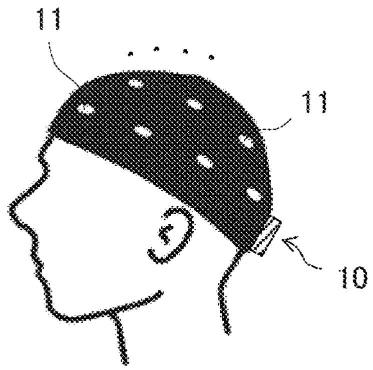

FIG. 1A and FIG. 1B are block diagrams showing one embodiment of a signal measurement system 1 according to the present invention. The signal measurement system 1 includes a sensing unit 10 that measures a state of an object to be measured, and a measurement signal processing unit 20 to be mounted to a PC or the like. The sensing unit 10 includes a sensor 11, an analog circuit 12, a compression part 13, and a wireless transmission part 14. It is to be noted that, although not illustrated, the sensing unit 10 is able to interiorly house a battery source such as a secondary battery or a power source such as a power generation element. The sensing unit 10 makes it possible to perform remote sensing with respect to the measurement signal processing unit 20 by interiorly housing a battery, a power generation element, or the like.

The measurement signal processing unit 20 includes a wireless reception part 21, a reconstruction part 22, and an analysis part 23, and also includes a control part 24 including a processor (a CPU or the like), and a storage part 25 that stores required data. The storage part 25, in addition to a reconstruction algorithm (achieved by a computer program or a hardware circuit) required for reconstruction includes a memory area in which each matrix data required for reconstruction is kept, and a work area in which a signal received from the sensing unit 10 as needed is stored or data in the middle of processing is temporarily stored. The control part 24 reads out the reconstruction algorithm from the storage part 25 and executes reconstruction processing as described below.

The sensor 11, in the present embodiment, has an electrode that measures a biological signal, and an electroencephalogram signal (an electrical signal), for example. The sensor 11, in a case of being a pair of attached-type electrodes, for example, or, in a case of a configuration in which a plurality of electrodes that are pre-dispersedly mounted on a headgear, for example, are placed so as to contact a scalp, as shown in FIG. 1B, makes it possible to measure the electroencephalogram signal to be emitted from a required head position when the headgear is worn on a head. The analog circuit 12 amplifies a weak electroencephalogram signal detected by the sensor 11, by an amplifier, and includes a filter circuit as needed and blocks a certain number of unwanted signals.

Figure 2A:
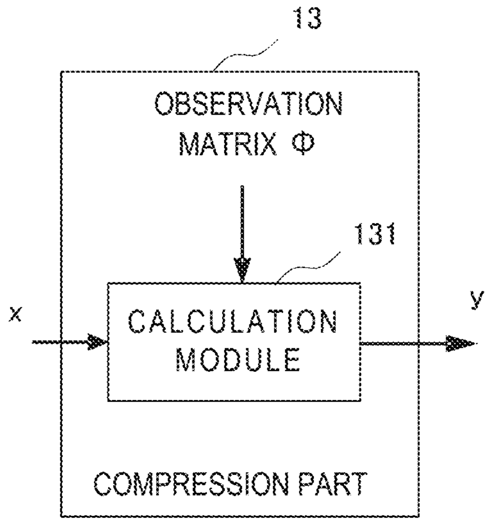
FIG. 2A and FIG. 2B are block diagrams showing functionally a partial configuration of the signal measurement system of FIG. 1A and FIG. 1B.
Figure 2B:
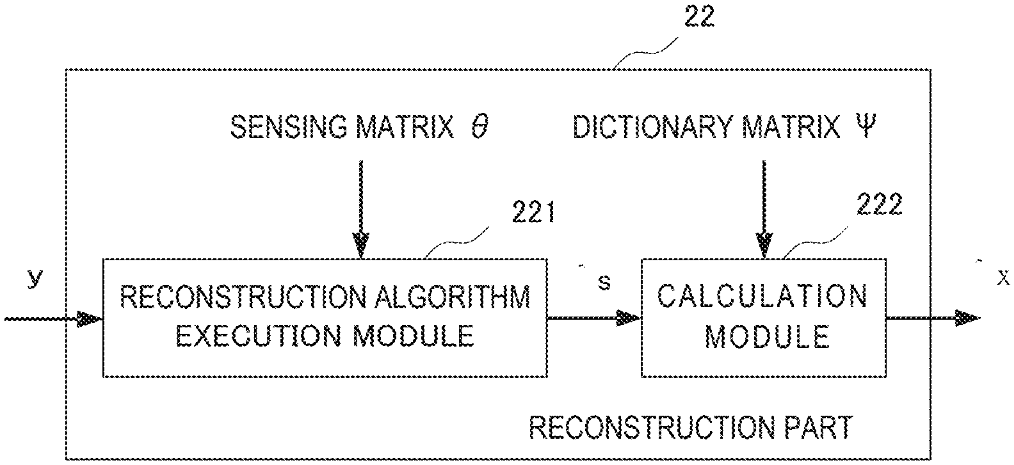

The compression part 13 samples the electroencephalogram signal outputted from the analog circuit 12 with a predetermined frequency, for example, 200 Hz, for 3 seconds as one frame. The compression part 13 executes sensing, that is, compressed processing while further decimating a signal to be sampled. The details of the compression part 13 are shown in FIG. 2A, which has a calculation module 131 that performs a product operation and calculates a compression signal y so as to be y=Φx by performing a calculation to obtain the product of the sampled electroencephalogram signal x and an observation matrix Φ used for compression. It is to be noted that the calculation module 131 may be configured in hardware or may be configured as a compression algorithm configured by software. In addition, although there is no limitation on the type of the observation matrix Φ and random undersampling, a matrix or the like according to a Gaussian distribution, a Bernoulli distribution is able to be used, in a case in which the random undersampling is used, a product calculation between a signal vector x and the observation matrix Φ in the compression part 13 is able to be replaced with an A/D conversion circuit that simply decimates a sampling point. The wireless transmission part 14 transmits the compression signal y toward the measurement signal processing unit 20 every time the compression signal y is obtained, for example, for each one frame (3 seconds).

It is to be noted that a sampling operation for each frame may be continuous or a specific signal within the electroencephalogram signal may be started as a trigger. In addition, a frame length is preferably set to include a time width that includes periodic tendency within the electroencephalogram signal.

Herein, a dictionary matrix Ψ that gives sparsity to a signal x will be described. As a case in which the signal x is able to be converted into a sparse vector s with sparsity by the dictionary matrix Ψ, a case in which each column vector configuring the dictionary matrix Ψ is correlated with the signal x may be considered. For example, a signal of which the waveform that has relatively similar characteristics continues, such as a biological signal or the like, is able to be regarded as a signal having constant correlation between extracted vectors since the signal characteristics do not significantly change from time to time. Based on such knowledge, the inventors have focused on the possibility to generate a sparse vector s that shows the required sparsity, when applying Ψ by which a signal (a past signal) obtained in the past is a column vector, as a dictionary matrix.

Referring back to FIG. 1A and FIG. 1B, the measurement signal processing unit 20 will be described. The wireless reception part 21 continuously receives the compression signal y transmitted from the wireless transmission part 14 for each frame. The received compression signal y is once kept in the storage part 25. It is to be noted that, in a case in which the reconstruction time becomes high speed relative to a frame reception period and streaming reception is possible, the compression signal y may be directly inputted to the reconstruction part 22 and may be processed.

Figure 3:
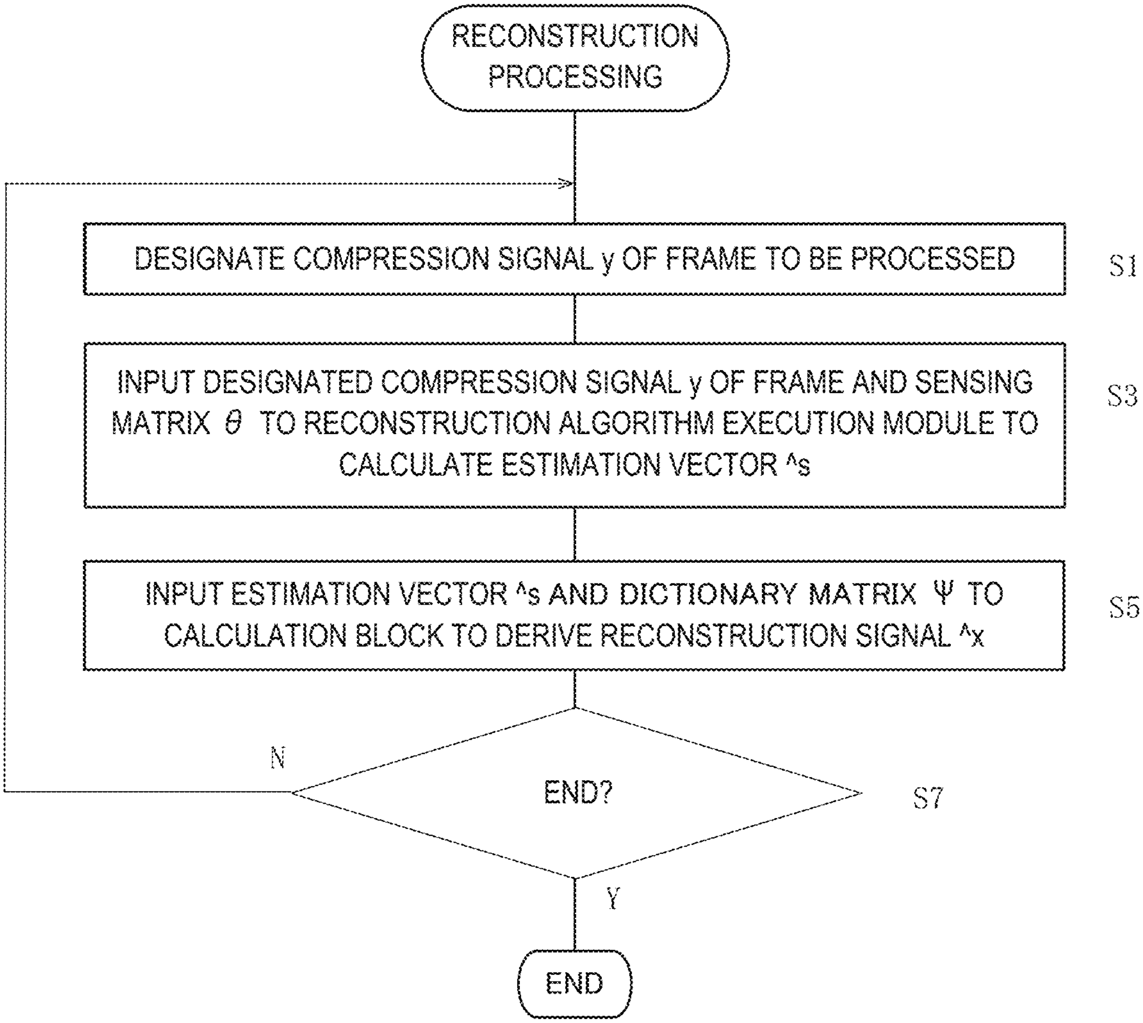
FIG. 3 is a flowchart showing an example of a procedure of reconstruction signal processing to be executed by a control part of the measurement signal processing unit.

The reconstruction part 22 includes a reconstruction algorithm execution module 221 and a calculation module 222 that performs the product operation. The reconstruction part 22 executes processing to derive a reconstruction signal ^x corresponding to the original signal x from the compression signal y according to the flowchart showing an example of the procedure of the reconstruction processing shown in FIG. 3 that is executed by the control part 24. The reconstruction part 22 first designates the compression signal y of a frame to be processed (Step S1), and then inputs the compression signal y and the sensing matrix θ (=Φ×Ψ) to the reconstruction algorithm execution module 221 in which the BSBL algorithm is employed, for example, to calculate the estimation vector ^s (Step S3). Subsequently, the calculated estimation vector ^s and the dictionary matrix Ψ are inputted to the calculation module 222, and the reconstruction signal ^x corresponding to a detection signal x is derived (Step S5). Subsequently, when the presence or absence of a next frame to be processed is monitored and the next frame is present, the same processing is repeated, otherwise the flow ends (Step S7). It is to be noted that the reconstruction signal ^x derived in Step S5 is outputted to the analysis part 23 or is kept in the storage part 25 or the like.

The analysis part 23 executes information processing on the reconstruction signal ^x according to an analysis purpose. In a case in which a detection target is the electroencephalogram signal, for example, the analysis is assumed to have applications not only in the healthcare and medical fields including diagnosis of dementia, epilepsy, sleep disorders, Alzheimer's disease, and other brain diseases, measurement of concentration, determination of pleasure or displeasure, or the like but in a wide range of fields. It is to be noted that the analysis is also able to be performed by other analysis devices using the reconstruction signal.

Figure 4A:
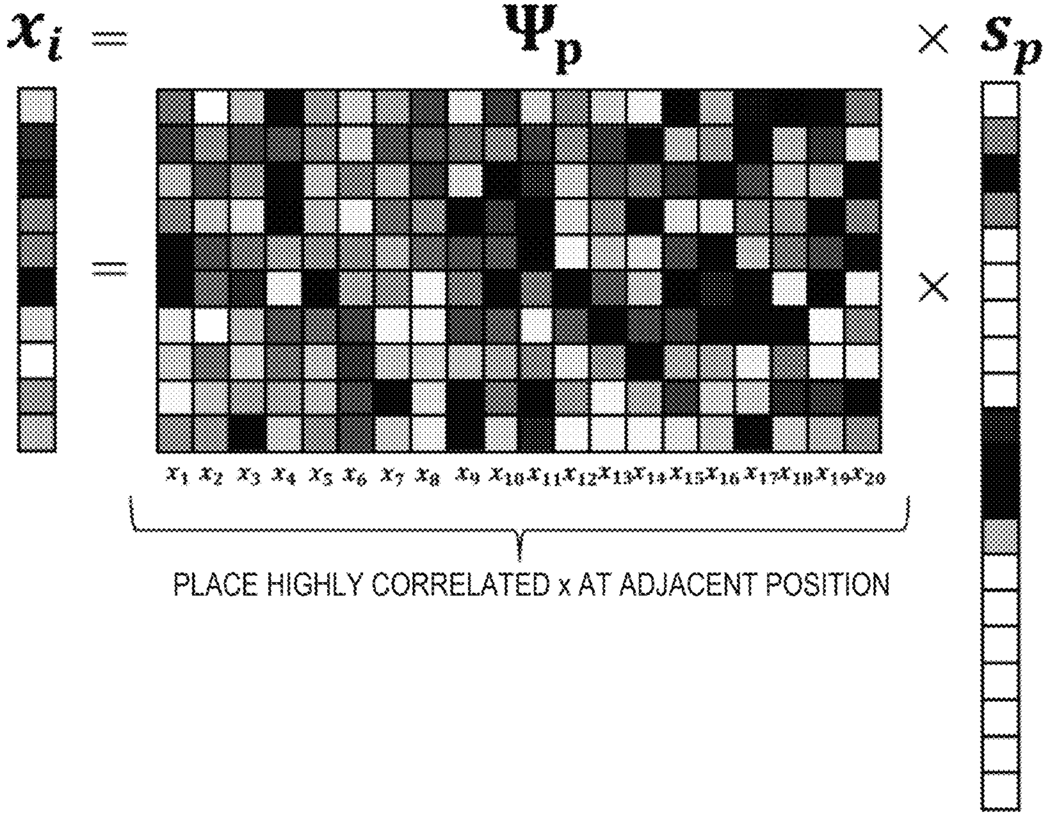
FIG. 4A and FIG. 4B are diagrams showing a configuration example of a dictionary matrix.
Figure 4B:
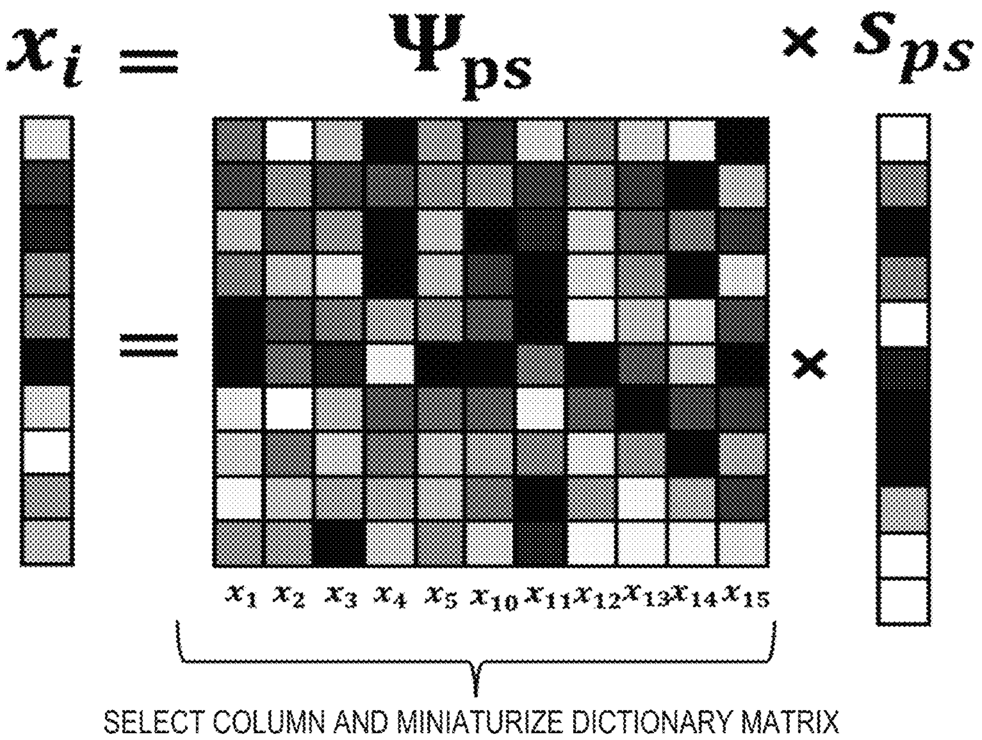

Next, a relationship between the dictionary matrix Ψ and the past signal will be described with reference to a simplified drawing of FIG. 4A and FIG. 4B. FIG. 4A and FIG. 4B are diagrams showing a configuration example of a dictionary matrix, (A) is a diagram of a dictionary with 20 columns in a case of being sorted, and (B) is a diagram of a smaller dictionary obtained by selecting 11 columns from the 20 columns in (A), in consideration of an appearance rate. A dictionary matrix $\Psi_p$ shown in FIG. 4A generates past signals side by side as column vectors, as a case in which the detection target is able to obtain a similar signal. For example, herein, 20 column vectors x1 to x20 configure the dictionary matrix $\Psi_p$. Although the 20 column vectors may be arranged in the same order as they were obtained at the time of sampling, herein, for example, the average frequency of the column vector is calculated (MATLAB (registered trademark) function meanfreq, for example), and the average frequency is sorted and rearranged in a height direction. In this manner, the average frequency is rearranged in order of height, that is, the highly correlated signals are placed in adjacent columns, so that the dictionary matrix $\Psi_p$ that enables conversion to a sparse vector $s_p$ with higher sparsity (clearly sparse and dense) is created.

In addition, the appearance rate of the average frequency of the column vector is obtained as a histogram, the column vector with the average frequency having a high appearance rate shown in FIG. 4B is selectively employed, that is, highly correlated signals are selected, which thus preferably enables conversion to a sparse vector $s_{ps}$ with high sparsity while being a smaller dictionary $\Psi_{ps}$. In addition, signals of the average frequency having the high appearance rate may be arranged. Alternatively, a selection of a frame having the high appearance rate from a larger number of frames by sort processing makes it possible to create a dictionary with a higher correlation.

Next, a test for verification of reconstruction accuracy will be described.

<Test>

(1) Test Procedure

Of the data used for the test, electroencephalogram signals (FP1-F7, Sampling Frequency: 200 Hz) for three subjects from the CHB-MIT Scalp EEG Database (see https://physionet.org/content/chbmit/1.0.0) were separated into frames (600 samples/frame) every 3 seconds and obtained 500 frames, which were used for test signals. The past signals used for the dictionary matrix were also obtained and used similarly from the CHB-MIT Scalp EEG Database, but from a different subject from the test signals. All reconstruction algorithms used BSBL, and the observation matrix (used random undersampling. This test was performed at compression ratios of 7 to 15, respectively.

(2) Content of Dictionary Matrix

Comparative example: (K-SVD dictionary) dictionary (5,000 columns) created by the K-SVD dictionary learning algorithm (see Non-Patent Literatures 2 and 3). What was created through a characteristic extraction method for high-dimensional data using the past signals Embodiment 1: (sort dictionary) sort the electroencephalogram signals in order of high correlation and use as a dictionary (10,000 columns). In the present test, the average frequency of each electroencephalogram signal is calculated and the electroencephalogram signals are arranged in order of average frequency and converted into a dictionary Embodiment 2: (3-6 Hz dictionary) select only the electroencephalogram signal corresponding to the average frequency of 3-6 Hz from the sort dictionary of Embodiment 1 and convert into a dictionary (4,140 columns)

Embodiment 3: (4-5 Hz dictionary) select only the electroencephalogram signal corresponding to the average frequency of 4-5 Hz from the sort dictionary of Embodiment 1 and convert into a dictionary (1,517 columns)

It is to be noted that Embodiments 1, 2, and 3 used the MATLAB (registered trademark) function meanfreq for calculation of the average frequency.

(3) Results

Figure 5:
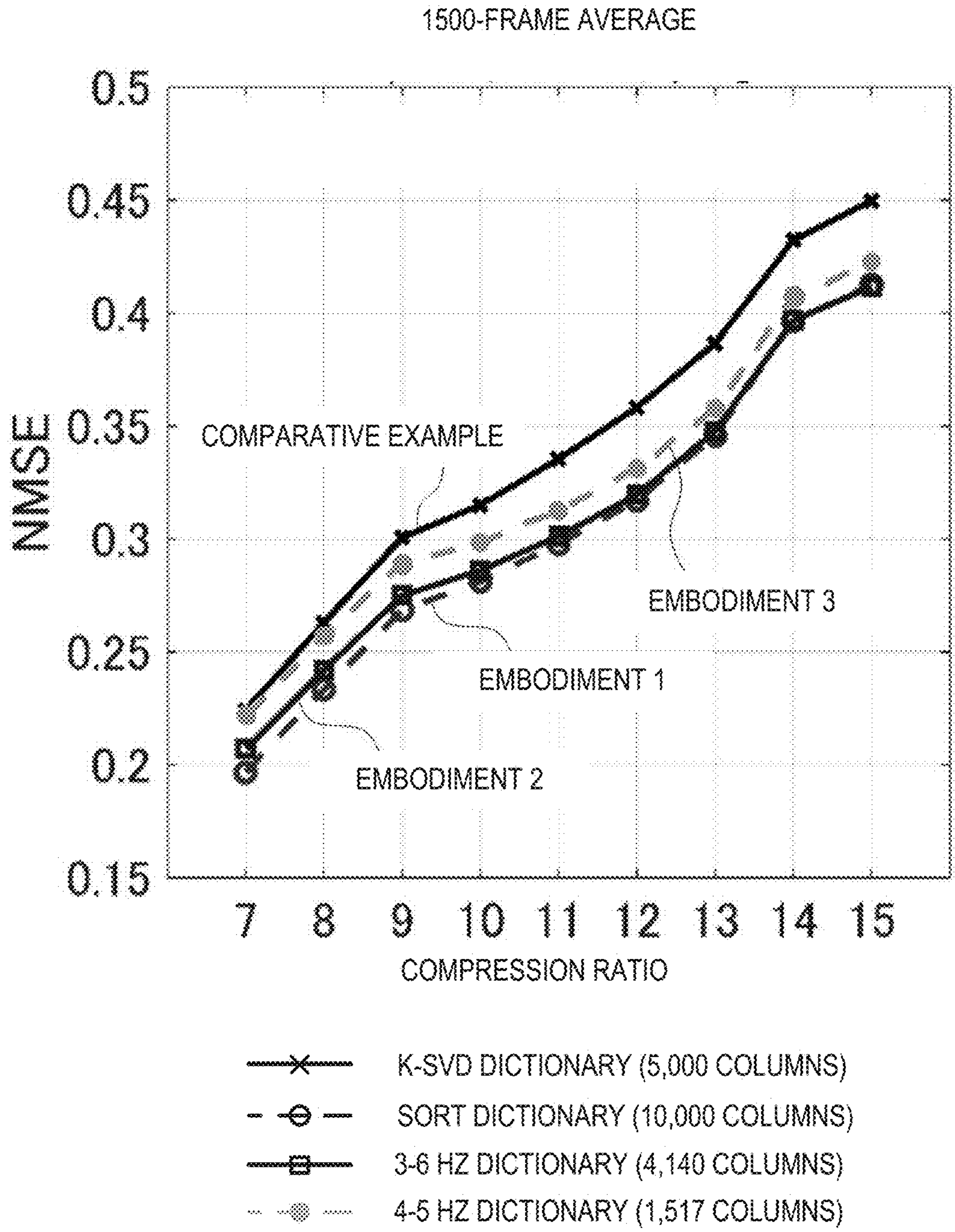
FIG. 5 is a chart of a test result showing a mean value of NMSE that is an index of a reconstruction error in each dictionary, with respect to a compression ratio.
Figure 6:
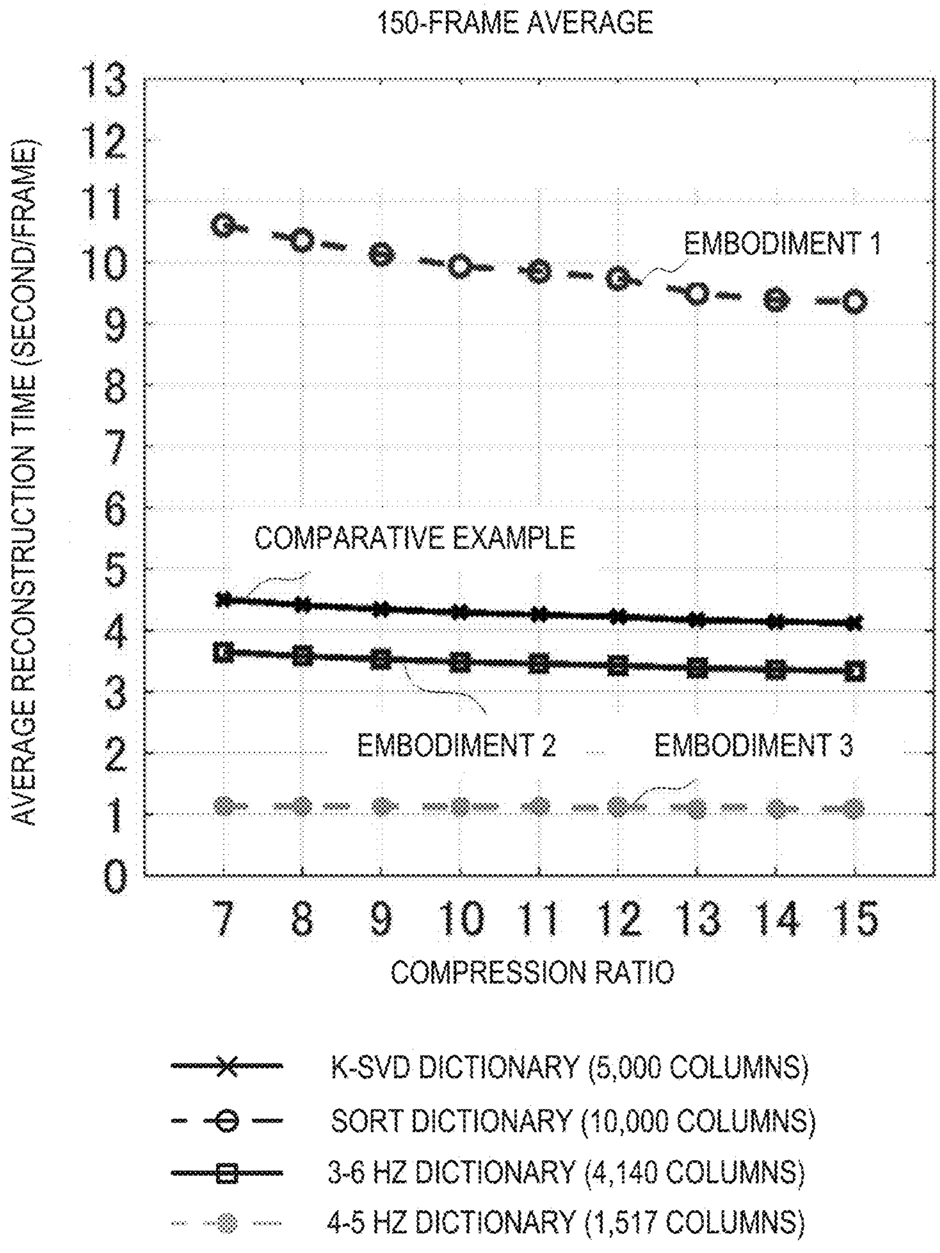
FIG. 6 is a chart of a test result showing average reconstruction time (for 150 frames) in each dictionary, with respect to a compression ratio.

Test results are shown in FIG. 5 and FIG. 6. FIG. 5 is a chart of a test result showing a mean value of NMSE that is an index of a reconstruction error in each dictionary, with respect to a compression ratio. The NMSE (Normalized Mean Square Error) shows a difference between the original signal x and the reconstruction signal ^x, and the reconstruction accuracy is high as the value is low. As is evident from FIG. 5, the sort dictionary that is "Embodiment 1" of the present invention was able to reduce the overall NMSE by about 0.05 than the K-SVD dictionary of a "comparative example" that is the conventional method, and was found to be more effective in an improvement of the reconstruction accuracy. In addition, although the NMSE of each dictionary of "Embodiment 2" and "Embodiment 3" is somewhat inferior in comparison with the dictionary of "Embodiment 1", the NMSE showed the high accuracy to the K-SVD dictionary of the "comparative example". It is to be noted that the compression ratio (=n/m) of the horizontal axis of FIG. 5 and FIG. 6 corresponds to a decimation rate of a signal in one frame, and a numerical value with a high compression ratio means high compression. In addition, the 1,500-frame average in FIG. 5 refers to the average of the number of detected frames (500 frames/person) by three subjects.

FIG. 6 is a chart of a test result showing reconstruction time (average of 150 frames of reconstruction time for one frame in this test) when the K-SVD dictionary, the sort dictionary, the 3-6 Hz dictionary, the 4-5 Hz dictionary are used, with respect to a compression ratio. Although no significant relationship between the compression ratio and the reconstruction time was seen, with respect to any dictionary, but it was checked that the reconstruction time was reduced as the number of columns in the dictionary matrix was reduced. It is to be noted that a PC with an Intel® Core™ i7-8565U CPU and 16 GB RAM was used for the measurement of computation time and MATLAB (registered trademark) 2021a software was used.

(4) Consideration

As shown in FIG. 5 and FIG. 6, the 3-6 Hz dictionary of "Embodiment 2" was found that an improved NMSE at all the compression ratios, as compared with the K-SVD dictionary of the "comparative example," and that the average reconstruction time was further able to be reduced by about 25%. Furthermore, the 4-5 Hz dictionary of "Embodiment 3" shows that compressed electroencephalographic data for 3 seconds was able to be reconstructed in about 1 second, which is less than 3 seconds. This means that, by enabling a significant reduction (a 3-second electroencephalogram signal is reconstructed in about 1 second) in reconstruction time while achieving higher reconstruction accuracy that the K-SVD being the "comparative example" (see FIG. 5), streaming reception, that is, reconstruction in nearly real time is able to be performed, and thus having high versatility was checked. In addition, in a case of 3-6 Hz dictionary of "Embodiment 2" as well, since the reconstruction time is close to 3 seconds, the streaming reception may also be expected by reducing somewhat the numbers of columns.

Figure 7:
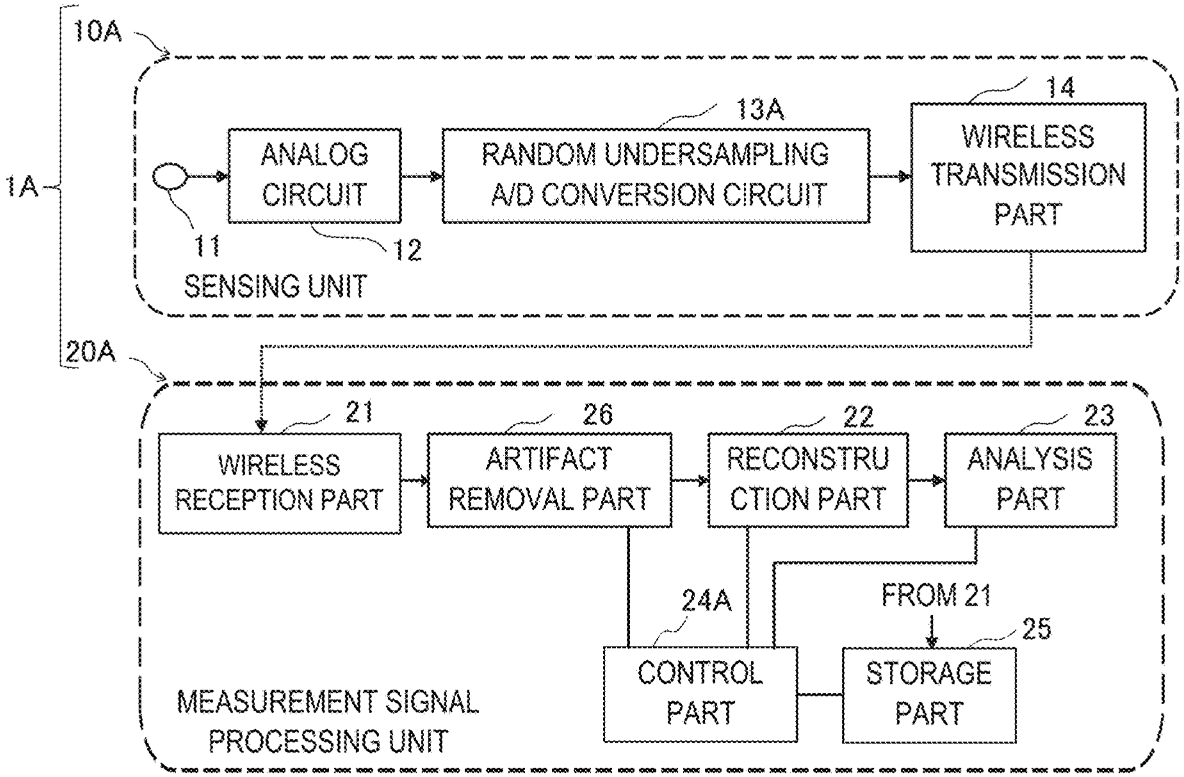
FIG. 7 is a block diagram showing a second embodiment of the signal measurement system according to the present invention.
Figure 8A:
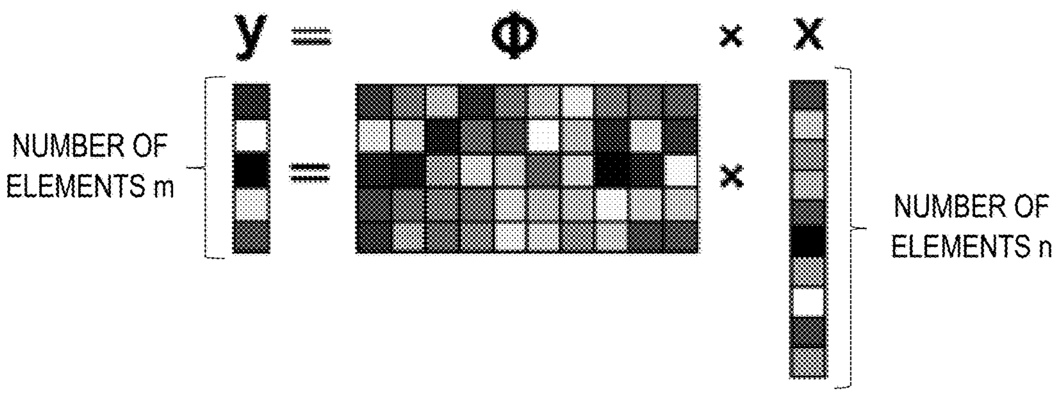
FIG. 8A to FIG. 8C are diagrams illustrating basic processing and the reconstruction processing of compressed sensing.
Figure 8B:
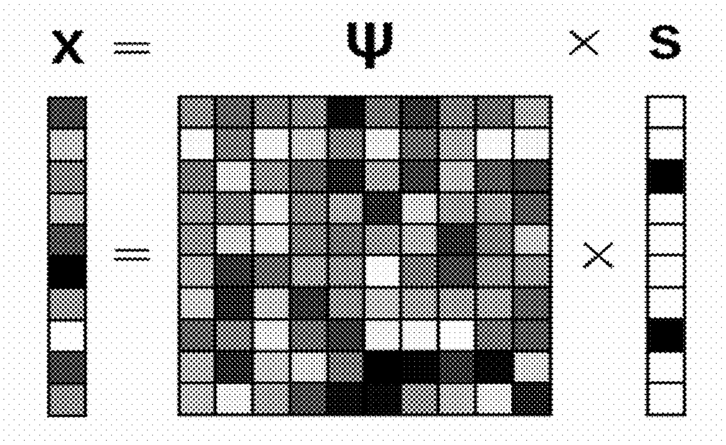
Figure 8C:
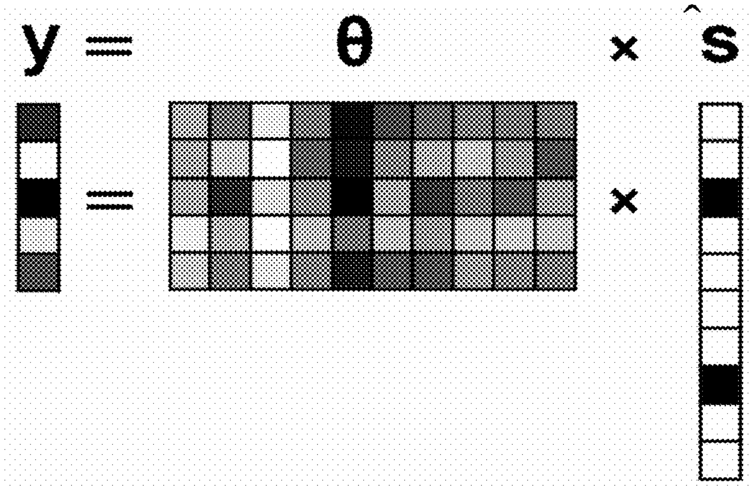

Subsequently, a second embodiment according to the present invention will be described by use of FIG. 7. In a case in which an artifact (noise) is mixed into the electroencephalogram signal, it is considered that the sparsity about the electroencephalogram signal may be impaired to such an extent and affect the reconstruction accuracy. Accordingly, a signal measurement system 1A shown in the second embodiment, as shown in FIG. 7, includes a random undersampling A/D conversion circuit 13A that decimates a sampling point, in place of the compression part 13 in the first embodiment, near the sensing unit 10A, and an artifact removal part 26 in the preceding stage of the reconstruction part 22 near the measurement signal processing unit 20A. The random undersampling A/D conversion circuit 13A, as publicly known, performs decimation sampling, that is, compression, at a frequency or timing lower than twice the maximum frequency of a signal.

In the case in which an artifact is mixed into the electroencephalogram signal, for example, a spectrum corresponding to the artifact can appear in a frequency component region. The artifact removal part 26 divides the compression signal received by the wireless reception part 21 into a plurality of independent component signals, further executes outlier detection processing as needed to effectively remove the artifact, and performs reconstruction and output after removal (see Patent Literature 1). After noise is removed as much as possible and sparsity is further increased, the reconstruction processing is performed on a signal by the reconstruction part 22, which enables reconstruction with higher accuracy.

It is to be noted that the present invention is able to include the following aspects.

(1) Although the embodiment describes an example in which BSBL is used as the reconstruction algorithm, the reconstruction algorithm is not limited to BSBL, and, as long as a constant reconstruction accuracy can be expected, for example, ADMM (Alternating Direction Method of Multipliers), CoSaMP (Compressive Sampling Matching Pursuit), and further other reconstruction algorithms are also applicable. In addition, according to an application, the OMP reconstruction algorithm is also applicable.

(2) The past signals to be applied to the dictionary matrix may be divided by past signals detected from a third party or a person himself/herself, or by gender, age group, or the like. The past signal may include a target signal of the same type, that is, a common target as well as the same target. In addition, the past signal may include noise and an artifact or may remove noise or an artifact. In addition, the past signals of a large number of columns may be obtained, and, every dictionary creation, created from among them according to a correlation condition, or a dictionary with required number of columns created in advance may be selected.

(3) Although the embodiment describes an aspect in which the past signal is sorted by average frequency, instead of or together with this, sorting may be performed based on a condition other than frequency. For example, since correlation is also able to be evaluated by the similarity of a signal waveform, sorting may be performed by a correlation coefficient with a reference signal.

(4) Although the embodiment describes a biological signal (a detection signal) such as an electroencephalogram signal as a target signal, in addition to the biological signal, any signal that includes a certain degree of periodicity or waveform similarity in whole or in part is applicable as a past signal. For example, in addition to the electroencephalogram signal, various biological signals such as myoelectricity, a sparsity signal (including a case in which the signal, when being converted using a dictionary matrix, has sparsity as a result), such as weather and environmental information, and current and voltage values obtained by an IoT sensor and an IoT device in a factory, especially a smart factory, for example, for monitoring an operational status in various facilities are applicable to the measurement of characteristics of other physical quantities. In this manner, the present invention is applicable to compression and reconstruction processing on information in nature, that is, obtainable physical quantity data. Furthermore, the present invention is also applicable to a signal to be artificially created.

(5) Although the embodiment describes an example in which the target signal is a one-dimensional signal, the present invention is not limited to this, and is also applicable to a higher-order signal such as an image signal in two or further three dimensions, and a highly versatile apparatus is able to be proposed. In this case, the same compression and reconstruction processing may be performed by one-dimensionally rearranging a multidimensional signal to be treated as a detection signal.

(6) The sensing unit 10 (10A), although being shown in a configuration integrally including a sensor 11, a compression part 13, and a wireless transmission part 14 in FIG. 1A and FIG. 7 for drawing purposes, in place of this, may be in a form in which each part is divided according to the application. For example, one or more sensors 11 may be in a form in which each of subunits is connected by wire to a host device integrally configured by the compression part 13 and the wireless transmission part 14 and is caused to function as a sensing unit.

(7) In the present embodiment, the measurement signal processing unit 20, although being configured by a computer such as a personal computer with a built-in processor (a CPU or the like), is also applicable to an apparatus with a built-in computer such as a server apparatus, a smartphone, or a portable type information processing apparatus such as a tablet, in addition to a personal computer (PC). In addition, a wired type is also applicable, in place of a wireless type, according to an application.

As described above, the signal reconstruction apparatus according to the present invention includes a reception part that receives a compression signal obtained by compressing a target signal by use of an observation matrix, and a reconstruction part that reconstructs the received compression signal. The reconstruction part preferably includes the observation matrix, and a dictionary matrix in which a past signal is arranged in each column, the past signal being a signal of the same type as the target signal and being a target signal obtained in advance for a plurality of times, preferably obtains an estimation vector by inputting the received compression signal, the observation matrix, and the dictionary matrix to a reconstruction algorithm execution module, and preferably derives a reconstruction signal corresponding to the target signal by inputting the obtained estimation vector and dictionary matrix to a calculation module for obtaining a product.

In addition, the signal compression apparatus according to the present invention preferably includes a compression part that converts the target signal to a compression signal compressed by use of an observation matrix, and a transmission part that transmits the compression signal to the signal reconstruction apparatus.

In addition, the signal processing system according to the present invention includes a compression part that converts a target signal to a compression signal compressed by use of an observation matrix, and a reconstruction part that reconstructs the compression signal compressed in the compression part. The reconstruction part preferably includes the observation matrix, and a dictionary matrix in which a past signal is arranged in each column, the past signal being a signal of the same type as the target signal and being a target signal obtained in advance for a plurality of times, preferably obtains an estimation vector by inputting the received compression signal, the observation matrix, and the dictionary matrix to a reconstruction algorithm execution module, and preferably derives a reconstruction signal corresponding to the target signal by inputting an obtained estimation vector and the dictionary matrix to a calculation module for obtaining a product.

According to these inventions, when the dictionary matrix in which a past signal is arranged in each column, the past signal being a signal of the same type as the target signal and being a target signal obtained in advance for a plurality of times is created, a dictionary including data that is correlated or highly correlated with the target signal is able to be created, and thus the use of this dictionary makes it possible to convert the obtained target signal into a vector with sparsity. Moreover, since the dictionary matrix is highly correlated, even a dictionary with a small number of columns is able to maintain a required reconstruction accuracy in addition to reducing reconstruction time. It is to be noted that the target signal is able to include a detection signal capable of being detected by a sensor and physical quantity data including various kinds of information existing in nature, and further an artificially created signal.

In addition, the dictionary matrix is preferably configured so that highly correlated signals are placed in adjacent columns, with respect to the past signals for the plurality of times. According to this configuration, highly correlated signals, when being sequentially arranged so as to be in close proximity to each other in a column direction, are able to be converted into vectors having high sparsity with a larger sparse clump, so that the reconstruction accuracy is maintained.

In addition, the dictionary matrix is preferably configured so that the highly correlated signals, among the past signals for the plurality of times, are selected and placed. According to this configuration, as a result of employing highly correlated signals, higher reconstruction accuracy is maintained.

In addition, the dictionary matrix is preferably placed in order of height of average frequencies, with respect to the past signals for the plurality of times. According to this configuration, the signals of adjacent average frequencies are placed in adjacent columns, and thus are able to be converted into vectors having high sparsity with a larger sparse clump, so that the reconstruction accuracy is maintained.

In addition, the dictionary matrix is preferably configured so that a signal having an average frequency with a high occurrence rate, among the past signals for the plurality of times, may be selected and placed. According to this configuration, as a result of employing the signal of the average frequency with a high occurrence rate, that is, the highly correlated signals, much higher reconstruction accuracy is maintained.

REFERENCE SIGNS LIST

1 signal measurement system (signal processing system)
10 sensing unit (signal compression apparatus)
11 sensor
13 compression part
131 calculation module
14 wireless transmission part
20 measurement signal processing unit (signal reconstruction apparatus)
21 wireless reception part (reception part)
22 reconstruction part
221 reconstruction algorithm execution module
222 calculation module
23 analysis part
24 control part
25 storage part

The invention claimed is:

1. A signal reconstruction apparatus comprising:

a reception part that receives a compression signal obtained by compressing a target signal by use of an observation matrix; and a reconstruction part that reconstructs the received compression signal, wherein the reconstruction part includes the observation matrix, and a dictionary matrix in which a past signal is arranged in each column, the past signal being a signal of a same type as the target signal and being a target signal obtained in advance for a plurality of times, the dictionary matrix being configured so that the highly correlated signals, among the past signals for the plurality of times, are selected and placed, obtains an estimation vector by inputting the received compression signal, the observation matrix, and the dictionary matrix to a reconstruction algorithm execution module, and derives a reconstruction signal corresponding to the target signal by inputting the obtained estimation vector and dictionary matrix to a calculation module for obtaining a product.

2. The signal reconstruction apparatus according to claim 1, wherein the dictionary matrix is configured so that highly correlated signals are placed in adjacent columns, with respect to past signals for the plurality of times.

3. A signal compression apparatus comprising:

a compression part that converts the target signal to a compression signal compressed by use of an observation matrix; and a transmission part that transmits the compression signal to the signal reconstruction apparatus according to claim 1.

4. A signal compression apparatus comprising:

a compression part that converts the target signal to a compression signal compressed by use of an observation matrix; and a transmission part that transmits the compression signal to the signal reconstruction apparatus according to claim 2.

5. A signal reconstruction apparatus comprising:

a reception part that receives a compression signal obtained by compressing a target signal by use of an observation matrix; and a reconstruction part that reconstructs the received compression signal, wherein the reconstruction part includes the observation matrix, and a dictionary matrix in which a past signal is arranged in each column, the past signal being a signal of a same type as the target signal and being a target signal obtained in advance for a plurality of times, the dictionary matrix being configured so that a signal having an average frequency with a high occurrence rate, among the past signals for the plurality of times, is selected and placed, obtains an estimation vector by inputting the received compression signal, the observation matrix, and the dictionary matrix to a reconstruction algorithm execution module, and derives a reconstruction signal corresponding to the target signal by inputting the obtained estimation vector and dictionary matrix to a calculation module for obtaining a product.

6. The signal reconstruction apparatus according to claim 5, wherein the dictionary matrix is configured so that average frequencies are placed in order of height, with respect to past signals for the plurality of times.

7. A signal compression apparatus comprising:

a compression part that converts the target signal to a compression signal compressed by use of an observation matrix; and a transmission part that transmits the compression signal to the signal reconstruction apparatus according to claim 5.

8. A signal compression apparatus comprising:

a compression part that converts the target signal to a compression signal compressed by use of an observation matrix; and a transmission part that transmits the compression signal to the signal reconstruction apparatus according to claim 6.

9. A signal processing system comprising:

a compression part that converts a target signal to a compression signal compressed by use of an observation matrix; and a reconstruction part that reconstructs the compression signal compressed in the compression part, wherein the reconstruction part includes the observation matrix, and a dictionary matrix in which a past signal is arranged in each column, the past signal being a signal of a same type as the target signal and being a target signal obtained in advance for a plurality of times, the dictionary matrix being configured so that the highly correlated signals, among the past signals for the plurality of times, are selected and placed, obtains an estimation vector by inputting the received compression signal, the observation matrix, and the dictionary matrix to a reconstruction algorithm execution module, and derives a reconstruction signal corresponding to the target signal by inputting an obtained estimation vector and the dictionary matrix to a calculation module for obtaining a product.

10. The signal processing system according to claim 9, wherein the dictionary matrix is configured so that highly correlated signals are placed in adjacent columns, with respect to past signals for the plurality of times.

* * * * *